United States Patent
Liu et al.

(10) Patent No.: US 11,404,526 B2
(45) Date of Patent: Aug. 2, 2022

(54) DISPLAY SUBSTRATE AND DISPLAY DEVICE

(71) Applicant: BOE TECHNOLOGY GROUP CO., LTD., Beijing (CN)

(72) Inventors: Wenqi Liu, Beijing (CN); Zhongyuan Sun, Beijing (CN); Jinxiang Xue, Beijing (CN); Chao Dong, Beijing (CN); Xiang Zhou, Beijing (CN); Kai Sui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 144 days.

(21) Appl. No.: 17/042,143

(22) PCT Filed: Jan. 10, 2020

(86) PCT No.: PCT/CN2020/071396
§ 371 (c)(1),
(2) Date: Sep. 27, 2020

(87) PCT Pub. No.: WO2020/147656
PCT Pub. Date: Jul. 23, 2020

(65) Prior Publication Data
US 2021/0020731 A1    Jan. 21, 2021

(30) Foreign Application Priority Data
Jan. 14, 2019  (CN) .......................... 201910032912.X

(51) Int. Cl.
*H01L 27/32* (2006.01)
*H01L 27/20* (2006.01)
(Continued)

(52) U.S. Cl.
CPC .......... *H01L 27/3276* (2013.01); *H01L 27/20* (2013.01); *H01L 27/3225* (2013.01); *H01L 41/00* (2013.01); *H01L 51/0097* (2013.01)

(58) Field of Classification Search
CPC . H01L 27/3276; H01L 27/20; H01L 27/3225; H01L 51/0097; H01L 41/00
(Continued)

(56) References Cited

U.S. PATENT DOCUMENTS

2017/0040306 A1*  2/2017  Kim ....................... H05K 1/181
2017/0213488 A1    7/2017  Koo et al.
(Continued)

FOREIGN PATENT DOCUMENTS

| CN | 104751773 A | 7/2015 |
| CN | 105228335 A | 1/2016 |

(Continued)

OTHER PUBLICATIONS

China Patent Office, First Office Action dated Feb. 27, 2020, for corresponding Chinese application 201910032912.X.

*Primary Examiner* — David Vu
*Assistant Examiner* — Brandon C Fox
(74) *Attorney, Agent, or Firm* — Houtteman Law LLC

(57) ABSTRACT

The present disclosure provides a display substrate and a display device. The display substrate comprises a base, a plurality of display units arranged on the base, a signal line and a control unit, wherein the signal line is configured to connect adjacent two display units of the plurality of display units; at least a part of the signal line is made of a shape memory material, and the part is deformed to different degrees under different excitation conditions; the control unit is configured to detect deformation of the base and apply a corresponding excitation condition to the signal line according to the deformation of the base, so that the signal (Continued)

line is in a deformation state adaptive to the deformation of the base.

20 Claims, 3 Drawing Sheets

(51) Int. Cl.
    *H01L 51/00*     (2006.01)
    *H01L 41/00*     (2013.01)

(58) Field of Classification Search
    USPC .......................................................... 257/40
    See application file for complete search history.

(56) References Cited

U.S. PATENT DOCUMENTS

2018/0081441 A1\*   3/2018   Pedder ................ G06F 3/03547
2020/0211437 A1\*   7/2020   Ahn .................... H01L 27/3276

FOREIGN PATENT DOCUMENTS

| | | |
|---|---|---|
| CN | 105449124 A | 3/2016 |
| CN | 105761616 A | 7/2016 |
| CN | 105761616 A1 | 7/2016 |
| CN | 107170374 A | 9/2017 |
| CN | 108470523 A | 8/2018 |
| CN | 108665810 A | 10/2018 |
| CN | 108986668 A | 12/2018 |
| CN | 208189187 A | 12/2018 |
| CN | 109754717 A | 5/2019 |
| KR | 20150018730 A | 2/2015 |

\* cited by examiner

DISPLAY SUBSTRATE AND DISPLAY DEVICE

CROSS-REFERENCE TO RELATED APPLICATIONS

This is a National Phase Application filed under 35 U.S.C. 371 as a national stage of PCT/CN2020/071396, filed on Jan. 10, 2020, an application claiming priority to Chinese patent application No. 201910032912.X entitled "Display Substrate and Display Device" filed with the China National Intellectual Property Administration on Jan. 14, 2019, the entire contents of which are incorporated herein by reference.

TECHNICAL FIELD

The present disclosure relates to the technical field of display, in particular to a display substrate and a display device.

BACKGROUND

With the rapid development of display technology, stretchable concept is gradually becoming a research hotspot, and along with the gradual mature development of OLED display technology, stretchable display slowly becomes a reality.

For stretchable display panel, since the stretchable region has relatively dense wiring, such as copper, titanium, aluminum, molybdenum, nano silver or metal oxide conductive wires, the conductive wire is often broken during the stretching process or is difficult to recover to its original shape by the end of stretching, which seriously affects normal display of the stretchable display panel.

SUMMARY

With respect to above problems in the prior art, the present disclosure provides a display substrate and a display device. As compared to the existing deformable display substrates, this display substrate can prevent the wiring in the circuit from breaking apart and thus unable to resume the original state before the deformation, thereby realizing deformation of the display substrate while ensuring normal display of the display substrate during the deformation process, which is favorable to popularization and use of the deformable display substrate.

The present disclosure provides a display substrate including a base and a plurality of display units arranged on the base, wherein the display substrate further includes a signal line and a control unit, the signal line is configured to connect adjacent two display units of the plurality of display units;

at least a part of the signal line is made of a shape memory material, and the part is deformed to different degrees under different excitation conditions;

the control unit is configured to detect deformation of the substrate and apply a corresponding excitation condition to the signal line according to the deformation of the substrate, so that the signal line is in deformation state adaptive to the deformation of the base.

Optionally, the control unit is connected to the signal line, and the control unit is configured to detect a stress applied to the signal line by the deformation of the substrate, so as to apply a corresponding excitation condition to the signal line according to the stress.

Optionally, the signal line is made of a magnetostrictive shape memory material, and the magnetostrictive shape memory material has different deformation states under different magnetic field strengths.

Optionally, the magnetostrictive shape memory material includes any one of nickel-manganese-gallium alloy, nickel-iron-gallium alloy, iron-palladium alloy, iron-nickel-cobalt-titanium alloy, cobalt-nickel alloy, and cobalt-manganese alloy.

Optionally, the control unit includes a piezoelectric sensing part, a magnetic field generation part, and a control part, the control part is connected to the piezoelectric sensing part and the magnetic field generation part, and the piezoelectric sensing part can sense the stress, convert the stress into a first current signal, and provide the first current signal to the control part;

the control part is configured to receive the first current signal, process the first current signal to obtain a second current signal, and provide the second current signal to the magnetic field generation part;

the magnetic field generation part can generate a magnetic field strength of a magnitude corresponding to the second current signal.

Optionally, the deformation of the base is stretching or shrinking of the base in any direction in the plane in which the base is located.

Optionally, the deformation state of the signal line is stretching or shrinking of the signal line in the plane in which the base is located along the deformation direction of the base.

Optionally, the piezoelectric sensing part and the plurality of display units are located on a same side as the base, and the magnetic field generation part is located on a side of the base facing away from the plurality of display units.

Optionally, an orthographic projection of the control unit on the base is located between orthographic projections of any adjacent two display units of the plurality of display units on the base.

Optionally, a connection line is disposed between the piezoelectric sensing part and the control part for supplying the first current signal to the control part, and the connection line is made of a same material as the signal line.

Optionally, the display unit includes an organic electroluminescent device.

The present disclosure also provides a display device including the display substrate.

Advantages of the present disclosure are as follows: by forming at least a part of the signal line from a shape memory material that is deformable under an excitation condition and by applying the excitation condition to the signal line through a control unit, the display substrate according to the disclosure enables the signal line to deform adaptive to the deformation of the base. As compared to the existing deformable display substrates, the display substrate can prevent the wiring in the circuit from breaking apart and thus unable to resume the original state before the deformation, thereby realizing deformation of the display substrate while ensuring normal display of the display substrate during the deformation process, which is favorable to popularization and use of the deformable display substrate.

By adopting the display substrate described above, the display device according to the present disclosure can keep normal display even in the deformation process, thus the deformable display device exhibits an improved quality.

DETAILED DESCRIPTION

To make those skilled in the art better understand the technical solutions of the present disclosure, the display substrate and display device provided by the present disclosure are described in further detail below with reference to the accompanying drawings and embodiments.

Figure 1:
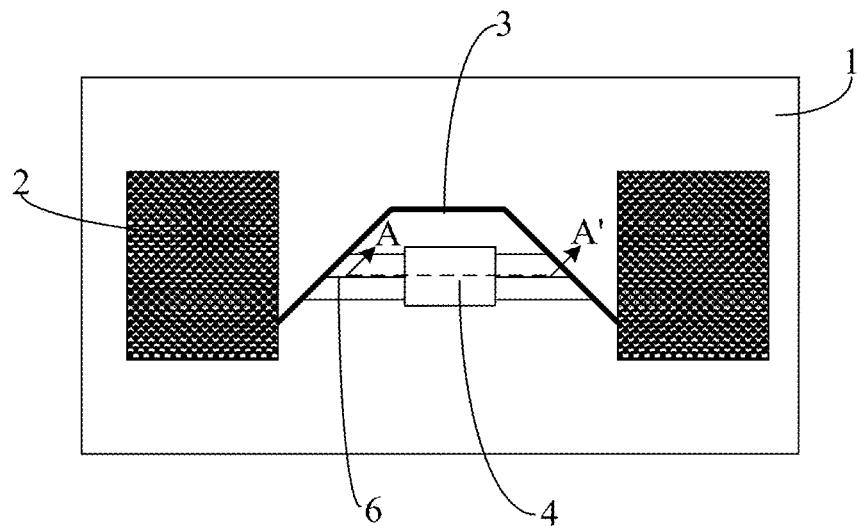
FIG. 1 is a top view of partial structure of a display substrate according to an embodiment of the present disclosure.
Figure 2:
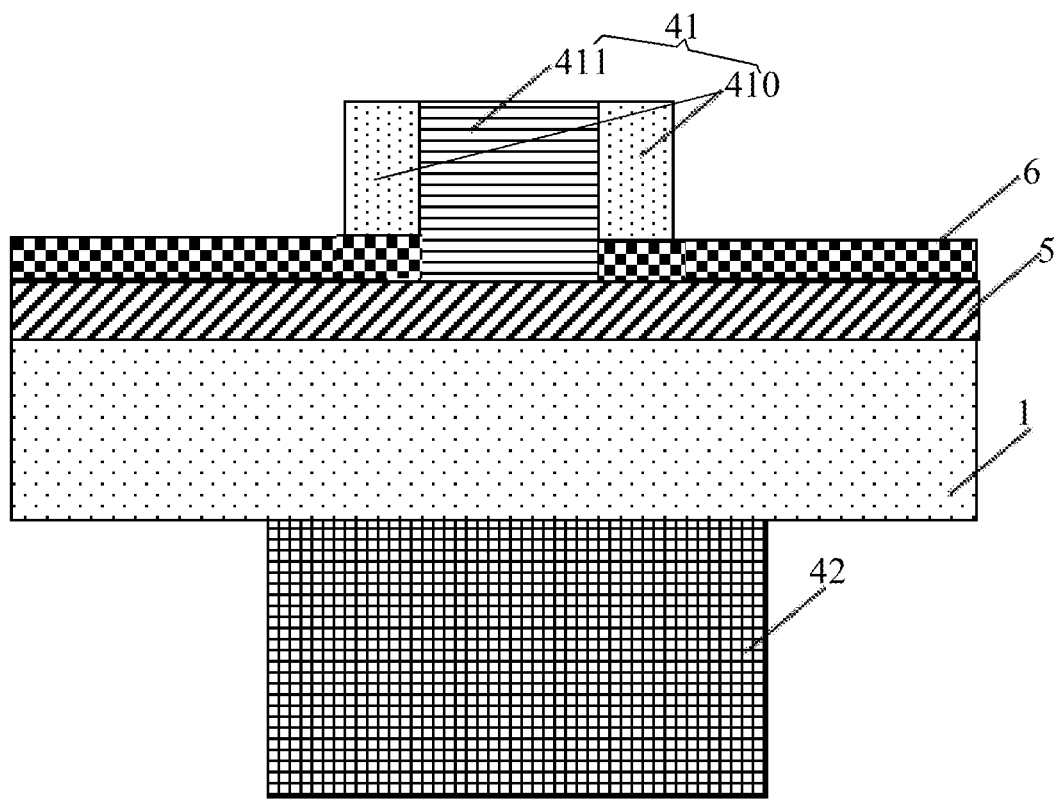
FIG. 2 is a cross-sectional view of the substrate shown in FIG. 1 taken along line AA'.
Figure 3:
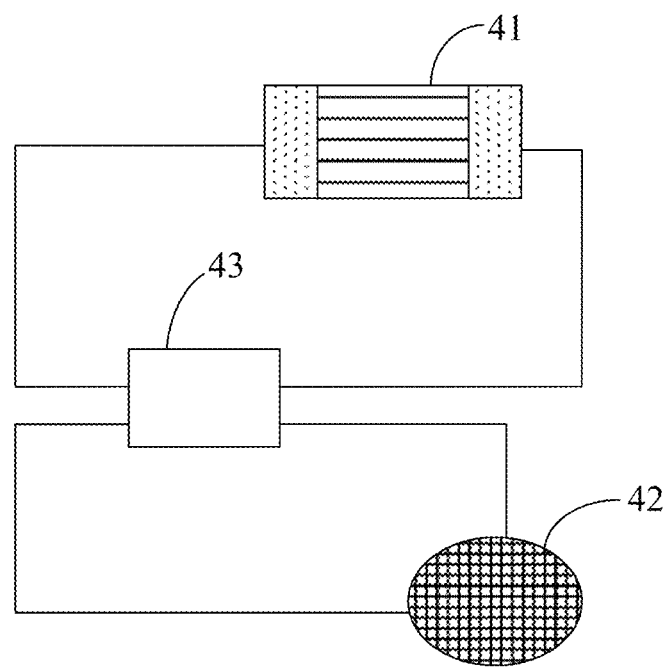
FIG. 3 is a schematic diagram of the control principle of the control unit in FIG. 1.

An embodiment of the present disclosure provides a display substrate, as shown in FIGS. 1-3, comprising a base 1 and a plurality of display units 2 arranged on the base 1, and further comprising a signal line 3 and a control unit 4, wherein the signal line 3 is configured to connect adjacent two display units 2 of the plurality of display units 2; at least a part of the signal line 3 is made of a shape memory material, and the part is deformed to different degrees under different excitation conditions; the control unit 4 is configured to detect deformation of the base 1, and apply a corresponding excitation condition to the signal line 3 according to the deformation of the base 1, so that the signal line 3 is in deformation state adaptive to the deformation of the base 1.

The base 1 is formed of a twistable, bendable and foldable material, for example, the base 1 is formed of polydimethylsiloxane (PDMS) or a deformable rubber material. Here, that the signal line 3 is in deformation state adaptive to the deformation of the base 1 means that the signal line 3 is in a state of being stretched or contracted along with the base 1; the amount of deformation of the signal line 3 is positively correlated with the amount of deformation of the base 1.

By forming at least a part of the signal line 3 from a shape memory material that is deformable under an excitation condition and by applying an excitation condition to the signal line 3 through the control unit 4, the signal line 3 can be deformed adaptive to the deformation of the base 1. As compared to the existing deformable display substrates, this display substrate can prevent the wiring in the circuit from breaking apart and thus unable to resume the original state before the deformation, thereby realizing deformation of the display substrate while ensuring normal display of the display substrate during the deformation process, which is favorable to popularization and use of the deformable display substrate.

In the present embodiment, orthographic projections of the signal line 3 and the control unit 4 on the base 1 are located in an interval area between the orthographic projections of the display units 2 on the base 1, and the signal line 3 is configured to transmit control signals and display signals when the display unit 2 displays.

The control unit 4 is connected to the signal line 3, and the control unit 4 is configured to detect a stress applied to the signal line 3 by the deformation of the base 1, so as to apply a corresponding excitation condition to the signal line 3 according to the stress. In this case, the deformation state of the signal line 3 can be controlled more accurately.

Preferably, in this embodiment, the signal line 3 is made of a magnetostrictive shape memory material, and the magnetostrictive shape memory material has different deformation states under different magnetic field strengths. The signal line 3 may be formed by a magnetron sputtering process.

Further preferably, the strength of the magnetic field is proportional to the degree of deformation of the magnetostrictive shape memory material.

It should be noted that, compared to the case where the magnetic field strength is proportional to the degree of deformation of the signal line 3, the magnetic field that determines the magnetic field strength can also cause the signal line 3 to have different deformation states within a certain range of deformation degree.

In this embodiment, the magnetostrictive shape memory material includes any one of nickel-manganese-gallium alloy, nickel-gallium alloy, iron-palladium alloy, iron-nickel-cobalt-titanium alloy, cobalt-nickel alloy, and cobalt-manganese alloy. Of course, the magnetostrictive shape memory material may also be other magnetic shape memory materials than those described above. The shape memory alloy has recoverable strain greater than that of common metal, with a maximum recoverable strain up to about 10%, while the strain of common alloy is only about 0.2%.

In this embodiment, the control unit 4 includes a piezoelectric sensing part 41, a magnetic field generation part 42, and a control part 43, the control part 43 being connected to the piezoelectric sensing part 41 and the magnetic field generation part 42, the piezoelectric sensing part 41 being capable of sensing the stress, converting the stress into a first current signal, and providing the first current signal to the control part 43. The control part 43 is configured to receive a first current signal, process the first current signal to obtain a second current signal, and provide the second current signal to the magnetic field generation part 42. The magnetic field generation part 42 can generate a magnetic field strength of a corresponding magnitude according to the second current signal.

The piezoelectric sensor 41 adopts a piezoelectric sensor that senses stress and converts the stress into a current signal to be output. The piezoelectric sensor is configured by two electrodes 410 and a piezoelectric material layer 411 disposed between the two electrodes 410, wherein the electrodes 410 are made of titanium, aluminum, molybdenum or nano silver and the like, and the piezoelectric material layer 411 is made of a material such as polyvinylidene fluoride (PVDF). Both the electrodes 410 and the piezoelectric material layer 411 may be formed by an ink-jet printing method. The piezoelectric sensing principle of the piezoelectric sensor is a well-developed technology, and is not described herein.

Figure 4:
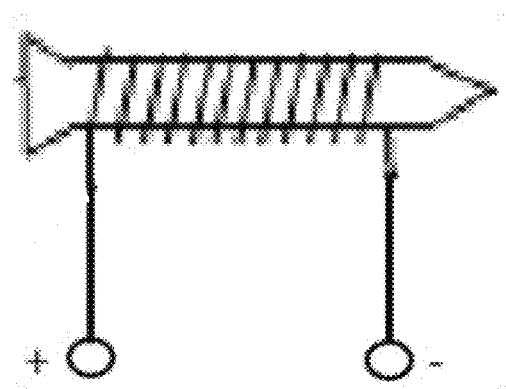
FIG. 4 is a schematic diagram of a coil-type electromagnet.
Figure 5:
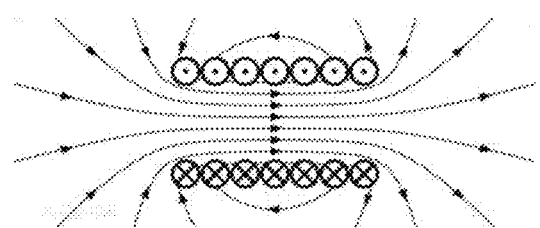
FIG. 5 is a schematic diagram of a magnetic field formed by two horseshoe electromagnets.

The magnetic field generation part 42 is a coil type electromagnet as shown in FIG. 4, that is, an electromagnet configured by inserting an iron core into an energized coil (e.g., a solenoid). The working principle and the mode of the coil type electromagnet are as follows: the energized solenoid itself creates a magnetic field; when the iron core is inserted into the electric solenoid, the iron core is magnetized by the magnetic field of the electric solenoid, and the magnetized iron core also becomes a magnet, so that the magnetic field of the electric solenoid and the magnetic field of the iron core are superposed, thus the magnetism of the coil type electromagnet is significantly enhanced. In order to make the electromagnet have stronger magnetism, the iron core is usually made into a horseshoe shape, and the coil is wound on the horseshoe-shaped iron core to form the horseshoe-shaped electromagnet, as shown in FIG. 5, the coil-type electromagnet is configured by an upper horseshoe-shaped electromagnet and a lower horseshoe-shaped electromagnet, the winding directions of the coil on the iron core of the upper horseshoe-shaped electromagnet and the lower horseshoe-shaped electromagnet are opposite, such as clockwise winding on one side, and anticlockwise winding on the other side. If the winding directions of the coils on the upper and lower horseshoe-shaped electromagnet cores are the same, the magnetizing actions of the two coils on the iron core would counteract each other, so that the iron core does not exhibit magnetism.

In addition, the iron core of the coil type electromagnet is made of soft iron rather than steel, this is because the strength of the magnetism of soft iron varies along with the magnitude of the current in the coil after the soft iron is magnetized, and the coil can be demagnetized when the coil is powered off, thus the strength of the magnetism of the electromagnet can be controlled via the magnitude of the current in the coil; but for steel, once magnetized, the steel can maintain magnetism for a long time and cannot be demagnetized, so that the strength of magnetism of steel cannot be controlled via the magnitude of current.

It should be noted that the electromagnet can be formed by simply using an energized coil (e.g., a solenoid). The energized solenoid itself can constitute a magnetic field, and the relationship between the direction of current in the energized solenoid and the direction of the magnetic field formed by the energized solenoid may be determined using Ampere's law (also called the right-hand screw rule). Magnetic induction lines outside the energized solenoid are emitted from the north pole and return to the south pole of the solenoid, and the direction of the magnetic field inside the energized solenoid is from the south pole to the north pole of the solenoid.

In this embodiment, the control part 43 is a Central Processing Unit (CPU) provided outside the display substrate. The CPU is provided with an analog-to-digital conversion circuit therein, which can convert an analog first current signal into a digital second current signal, thereby achieving a more accurate control of the magnitude of magnetic field of the magnetic field generation part 42 by the current signal.

In this embodiment, the deformation of the base 1 is stretching or shrinking of the base 1 in any direction in the plane in which the base is located. The deformation state of the signal line 3 is stretching or shrinking of the signal line 3 in the plane in which the base 1 is located along the deformation direction of the base 1.

It should be noted that the deformation of the base 1 may also be stretching, shrinking or twisting of the base 1 in any plane in space, and correspondingly, the deformation state of the signal line 3 may also be stretching, shrinking or twisting of the signal line 3 in any direction in space along with the deformation of the base 1.

In this embodiment, preferably, the piezoelectric sensing part 41 and the plurality of display units 2 are located on the same side of the base 1, and the magnetic field generation part 42 is located on a side of the base 1 facing away from the plurality of display units 2. Preferably, the magnetic field generation part 42 is disposed against the base 1, which facilitates the action of the magnetic field on the signal line 3.

In addition, in the manufacturing process of the display substrate, the piezoelectric sensing part 41 and the plurality of display units 2 are firstly manufactured on a hard substrate such as a glass substrate, then the piezoelectric sensing part 41 and the display units 2 are peeled off from the hard substrate, and then the piezoelectric sensing part 41 and the display units 2 are attached to the base 1 by using an adhesive 5 such as optical acrylic adhesive (OCA adhesive), so that the base 1 becomes a back film of the display substrate, and since the base 1 is deformable, the base 1 is favorable to realizing a deformable display substrate. As compared to the deformable base 1, hard substrate can be adapted to various process conditions in the process of manufacturing the display unit 2 on the display substrate, thus it is necessary to first manufacture the display unit 2 on the hard substrate.

Further preferably, the orthographic projection of the control unit 4 on the base 1 is located between the orthographic projections of any adjacent two display units 2 of the plurality of display units 2 on the base 1, and is located at an intermediate position in the interval area between the orthographic projections of the two display units 2. With this arrangement, the magnetic field generated by the magnetic field generation part 42 in the control unit 4 acts on the magnetic field of the signal line 3 of magnetostrictive shape memory material more evenly, which is favorable to normal deformation of the signal line 3.

In this embodiment, a connection line 6 is disposed between the piezoelectric sensing part 41 and the control part 43 to provide the control part 43 with a first current signal. The connection line 6 may be made of the same material as the signal line 3. With this arrangement, the connection line 6 between the control unit 4 and the signal line 3 can also deform correspondingly under the action of the magnetic field, thereby preventing the connection line 6 from being torn apart, such that the control unit 4 can normally control the stretching and contracting deformation of the signal line 3. Optionally, as shown in FIG. 1, the control unit 4 may be connected to the signal line 3 through the connection line 6, and the connection line 6 at least a partially overlaps with the wiring of the signal line 3, so that the connection line 6 and the signal line 3 may be deformed correspondingly under the action of a magnetic field, and the connection line 6 is more effectively prevented from being torn apart.

It should be noted that the connection line 6 between the control unit 4 and the signal line 3 may also be made of a non-magnetostrictive shape memory material, such as titanium, aluminum, and molybdenum.

Figure 6:
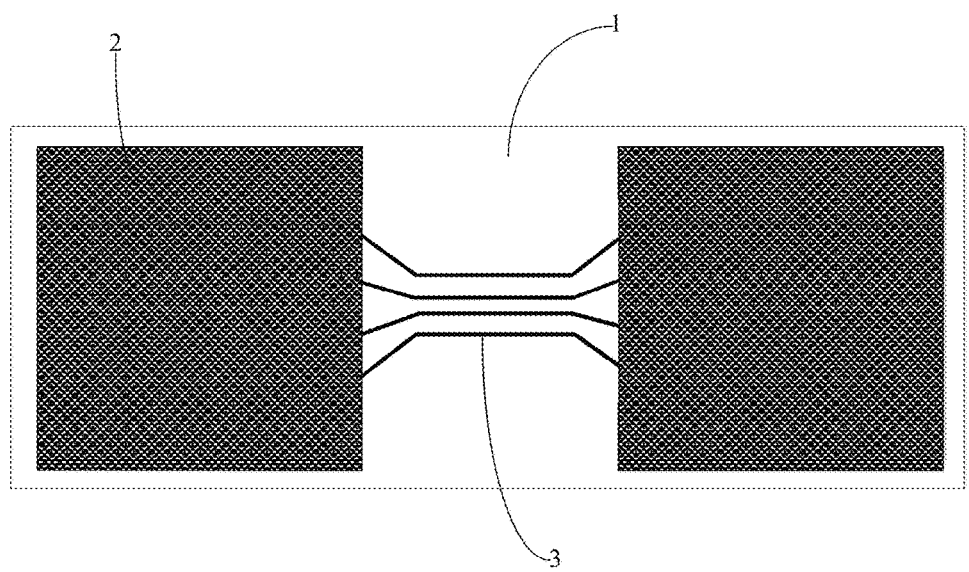
FIG. 6 is a schematic top view of a state of a signal line without a magnetic field applied of the display substrate according to an embodiment of the present disclosure.
Figure 7:
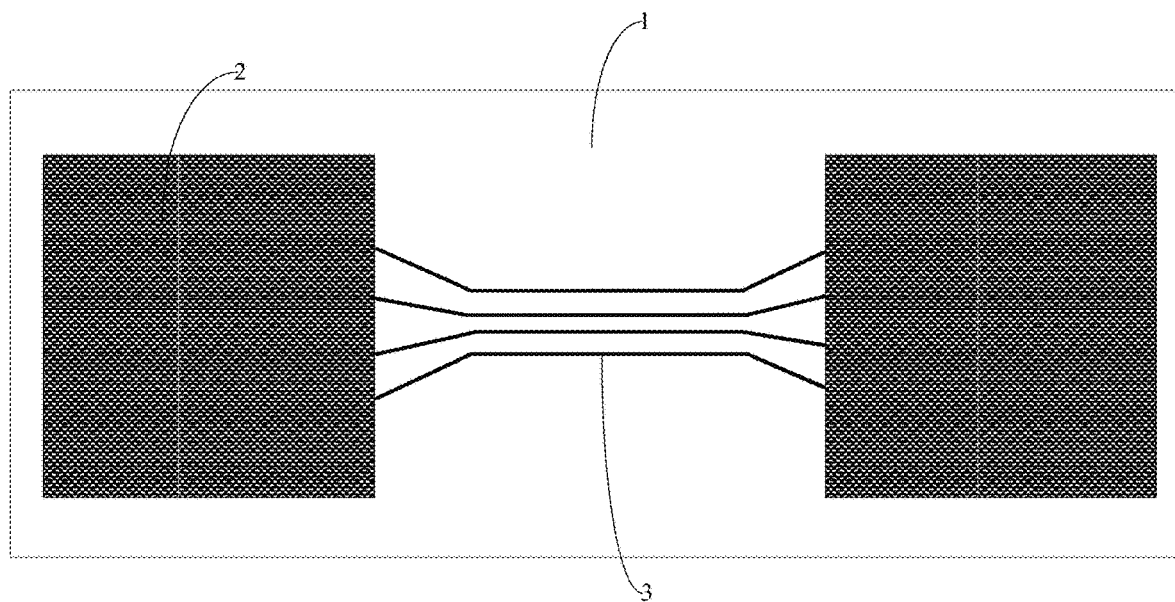
FIG. 7 is a schematic top view of a state of the signal line with a magnetic field applied of the display substrate according to an embodiment of the present disclosure.

In this embodiment, as shown in FIGS. 6 and 7, the specific control principle and process of the control unit 4 are as follows: when the display substrate is stretched, the piezoelectric sensor senses the stress applied to the signal line 3, and converts the stress into a first current signal to be fed back to the CPU. The CPU performs analog-to-digital conversion processing on the first current signal and feeds back a second current signal obtained after processing to the electromagnet. When the display substrate is stretched, the first current signal increases, so does the magnetic field, the magnetostatic force of the magnetic field on the unfavorably oriented martensite modification in the signal line 3 is utilized to cause the favorably oriented martensite modification to grow and engulf the unfavorably oriented modification (represented by movement of twin boundaries), thereby causing macroscopic deformation of the signal line 3; the deformation amount of the signal line 3 may be changed by the magnitude of the magnetic field strength, and the twin boundaries return to the original positions when the magnetic field strength is reduced or removed. The principle of the control unit 4 controlling the deformation of the signal line 3 when the display substrate is contracted is the same as above.

In this embodiment, the display unit 2 includes an organic electroluminescent device. Such a display unit 2 is more suitable for a display substrate that is deformable since the organic electroluminescent device can realize flexible display of the display substrate. Of course, the display unit 2 may also be another device that is adaptive to flexible display.

The advantages of this embodiment: by forming at least a part of the signal line from a shape memory material that is deformable under an excitation condition and by applying the excitation condition to the signal line through a control unit, the display substrate according to the present disclosure enables the signal line to deform adaptive to the deformation of the base. As compared to the existing deformable display substrates, this display substrate can prevent the wiring in the circuit from breaking apart and thus unable to resume the original state before the deformation, thereby realizing deformation of the display substrate while ensuring normal display of the display substrate during the deformation process, which is favorable to popularization and use of the deformable display substrate.

An embodiment of the present disclosure provides a display device, including the display substrate in the above embodiment.

By adopting the display substrate in the embodiment, the display device can keep normal display in the deformation process, and the quality of the deformable display device is improved.

The display panel provided by the present disclosure may be any product or component with a display function, such as OLED panel, OLED television, display, mobile phone, navigator and the like, and may also be a semi-finished product of the product or component with the display function.

It should be understood that above embodiments are just examples for illustrating the principle of the disclosure, however, the present disclosure is not limited thereto. Various modifications and variations can be made by a person skilled in the art without departing from the spirit and the scope of the present disclosure. These modifications and variations should be considered to be within protection scope of the present disclosure.

What is claimed is:

1. A display substrate comprising a base, and a plurality of display units arranged on the base, wherein the display substrate further comprises a signal line and a control unit,
the signal line is configured to connect adjacent two display units of the plurality of display units;
at least a part of the signal line is made of a shape memory material, and the part is deformed to different degrees under different excitation conditions;
the control unit is configured to detect deformation of the base and apply a corresponding excitation condition to the signal line according to the deformation of the substrate, so that the signal line is in deformation state adaptive to the deformation of the base.

2. The display substrate of claim 1, wherein the control unit is connected to the signal line, and the control unit is configured to detect a stress applied to the signal line by the deformation of the base, so as to apply the corresponding excitation condition to the signal line according to the stress.

3. The display substrate of claim 2, wherein the signal line is made of a magnetostrictive shape memory material having different deformation states under different magnetic field strengths.

4. The display substrate of claim 3, wherein the magnetostrictive shape memory material comprises any one of nickel-manganese-gallium alloy, nickel-iron-gallium alloy, iron-palladium alloy, iron-nickel-cobalt-titanium alloy, cobalt-nickel alloy, and cobalt-manganese alloy.

5. The display substrate of claim 3, wherein the control unit comprises a piezoelectric sensing part, a magnetic field generation part, and a control part, the control part being connected to the piezoelectric sensing part and the magnetic field generation part, the piezoelectric sensing part being capable of sensing the stress and converting the stress into a first current signal, and providing the first current signal to the control part;
the control part being configured to receive the first current signal, process the first current signal to obtain a second current signal, and provide the second current signal to the magnetic field generation part;
the magnetic field generation part being capable of generating a magnetic field strength of a magnitude corresponding to the second current signal.

6. The display substrate of claim 5, wherein the deformation of the base is stretching or shrinking of the base in any direction in a plane in which the base is located.

7. The display substrate of claim 6, wherein the deformation state of the signal line is stretching or shrinking of the signal line in a plane in which the base is located along deformation direction of the base.

8. The display substrate of claim 5, wherein the piezoelectric sensing part is located on a same side of the base as the plurality of display units, and the magnetic field generation part is located on a side of the base facing away from the plurality of display units.

9. The display substrate of claim 1, wherein an orthographic projection of the control unit on the base is between orthographic projections of any adjacent two display units of the plurality of display units on the base.

10. The display substrate of claim 5, wherein a connection line is disposed between the piezoelectric sensing part and the control part for supplying the first current signal to the control part, and the connection line being made of a same material as the signal line.

11. The display substrate of claim 1, wherein the display unit comprises an organic electroluminescent device.

12. A display device comprising a display substrate,
wherein the display device comprises a base, and a plurality of display units arranged on the base, wherein the display substrate further comprises a signal line and a control unit,
the signal line is configured to connect adjacent two display units of the plurality of display units;
at least a part of the signal line is made of a shape memory material, and the part is deformed to different degrees under different excitation conditions;
the control unit is configured to detect deformation of the base and apply a corresponding excitation condition to the signal line according to the deformation of the substrate, so that the signal line is in deformation state adaptive to the deformation of the base.

13. The display device of claim 12, wherein the control unit is connected to the signal line, and the control unit is configured to detect a stress applied to the signal line by the deformation of the base, so as to apply the corresponding excitation condition to the signal line according to the stress.

14. The display device of claim 13, wherein the signal line is made of a magnetostrictive shape memory material having different deformation states under different magnetic field strengths.

15. The display device of claim 14, wherein the magnetostrictive shape memory material comprises any one of nickel-manganese-gallium alloy, nickel-iron-gallium alloy, iron-palladium alloy, iron-nickel-cobalt-titanium alloy, cobalt-nickel alloy, and cobalt-manganese alloy.

16. The display device of claim 14, wherein the control unit comprises a piezoelectric sensing part, a magnetic field generation part, and a control part, the control part being connected to the piezoelectric sensing part and the magnetic field generation part, the piezoelectric sensing part being capable of sensing the stress and converting the stress into a first current signal, and providing the first current signal to the control part;

the control part being configured to receive the first current signal, process the first current signal to obtain a second current signal, and provide the second current signal to the magnetic field generation part;

the magnetic field generation part being capable of generating a magnetic field strength of a magnitude corresponding to the second current signal.

17. The display device of claim 16, wherein the deformation of the base is stretching or shrinking of the base in any direction in a plane in which the base is located.

18. The display device of claim 17, wherein the deformation state of the signal line is stretching or shrinking of the signal line in a plane in which the base is located along deformation direction of the base.

19. The display device of claim 16, wherein the piezoelectric sensing part is located on a same side of the base as the plurality of display units, and the magnetic field generation part is located on a side of the base facing away from the plurality of display units.

20. The display device of claim 12, wherein an orthographic projection of the control unit on the base is between orthographic projections of any adjacent two display units of the plurality of display units on the base.

* * * * *